United States Patent [19]

Kamiyama

[11] Patent Number: 5,352,623
[45] Date of Patent: Oct. 4, 1994

[54] METHOD FOR MANUFACTURING A SEMICONDUCTOR DEVICE

[75] Inventor: Satoshi Kamiyama, Tokyo, Japan

[73] Assignee: NEC Corporation, Tokyo, Japan

[21] Appl. No.: 196,486

[22] Filed: Feb. 15, 1994

[30] Foreign Application Priority Data

Feb. 17, 1993 [JP] Japan .................. 5-027061

[51] Int. Cl.⁵ .......................................... H01L 21/70
[52] U.S. Cl. ........................... 437/52; 437/47;
437/60; 437/235; 437/238; 437/919
[58] Field of Search ............ 437/47, 48, 52, 60,
437/235, 238, 919; 257/310

[56] References Cited

U.S. PATENT DOCUMENTS

| | | | |
|---|---|---|---|
| 4,495,219 | 1/1985 | Kato et al. | 437/919 |
| 5,248,629 | 9/1993 | Muroyama | 437/919 |

FOREIGN PATENT DOCUMENTS 145584  3/1986  Japan .................. 257/310

*Primary Examiner*—Tom Thomas
*Attorney, Agent, or Firm*—Burns, Doane, Swecker & Mathis

[57] ABSTRACT

A method for manufacturing a semiconductor device, wherein a thin film of tantalum oxide is formed as a dielectric film in a capacitor element, increases capacitance per unit area and reduces a leakage current in the capacitor element of DRAM memory cells. The method includes steps of forming a polysilicon film constituting a lower electrode of the capacitor element, removing a natural oxide film from the surface of the polysilicon film, nitriding the surface of the polysilicon by rapid thermal nitriding (RTN) using lamp-annealing, forming a tantalum oxide film, densifying and nitriding consecutively the tantalum oxide film, and forming an upper capacitor electrode thereon. The capacitor element formed by the method has a large capacitance per unit area $C_s = 13.8$ fF/$\mu m^2$.

11 Claims, 5 Drawing Sheets

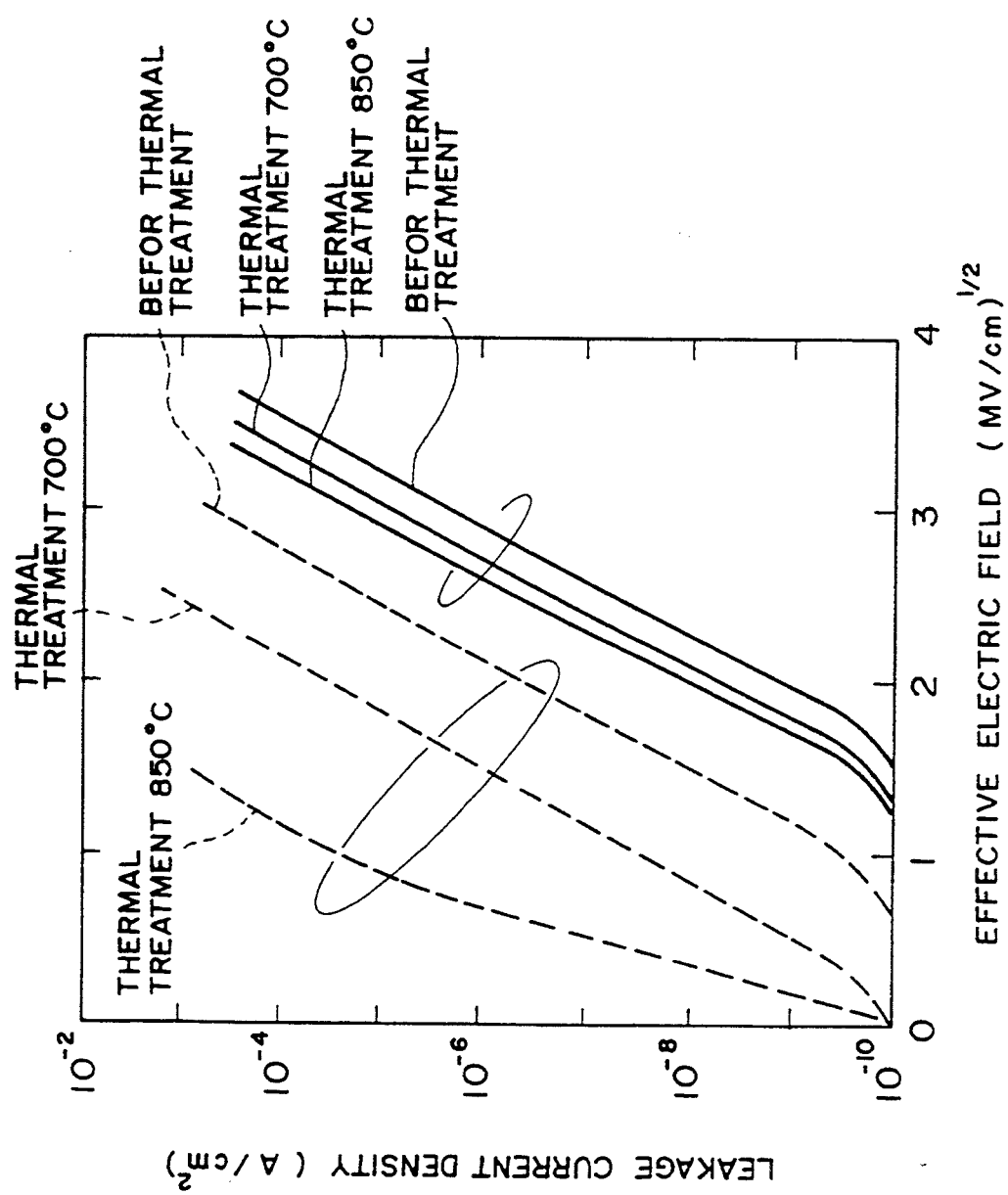

METHOD FOR MANUFACTURING A SEMICONDUCTOR DEVICE

BACKGROUND OF THE INVENTION (a) Field of the Invention

The present invention relates to a method for manufacturing a semiconductor device, and more particularly, to a method for manufacturing a semiconductor device in which tantalum oxide film is used for an insulating film in a capacitor element.

(b) Description of the Related Art

An attempt has been made to employ an insulating film having a higher dielectric constant in capacitor elements of memory cells in a VLSI, to be developed as a dynamic random access memory (DRAM) device of a 256 Mbit storage capacity or more, since such an insulating film is capable of effectively increasing the capacitance per unit area in the VLSI.

Of the insulating films having a higher dielectric constant, a tantalum oxide film formed by chemical vapor deposition (CVD) has been intensely studied. This is because the tantalum oxide film has a large dielectric constant ranging from 25 to 30 and has an excellent step-coverage characteristic among other materials having higher dielectric constants, and furthermore, it is more easily deposited than the other materials.

FIGS. 1A and 1B are partial sectional views of a semiconductor device showing successive steps in a conventional method for manufacturing a stacked capacitor element in a DRAM cell. In FIG. 1A, the lower electrode 2 of a stacked capacitor element made of polysilicon is connected to an active region 51A of a transistor element by way of a through-hole 57 formed in a first interlayer insulating film 47 and a second interlayer insulating film 48 overlying the transistor element including a bit line 56.

A tantalum oxide film 11 is formed on a lower capacitor electrode 2 by a low pressure chemical vapor deposition (LPCVD) technique using pentaethoxytantalum (Ta(OC$_2$H$_5$)$_5$) as a source gas. The tantalum oxide film 11 is then thermally treated at a high temperature in an oxygen atmosphere for reducing the leakage current through the tantalum oxide film 11. The thermal treatment is conducted at a temperature ranging from 700° to 900° C. Subsequently, an upper capacitor electrode 3 made of tungsten (W) is formed on the tantalum oxide film 11 (see FIG. 1B). A capacitor element having the lower electrode 2, insulating film 11 and upper electrode 3 is thus formed in the DRAM device.

The capacitor element formed by the conventional method as described above has a drawback in which the capacitor element thus obtained does not have enough capacitance per unit area Cs (Cs=11.5 fF/$\mu$m$^2$), which is only equivalent to that of about 3 nm (nanometer) in terms of the thickness of the SiO$_2$ film. The capacitance per unit area Cs of the tantalum oxide film is not enough for a capacitor element of a 256 Mbit DRAM device. Moreover, the capacitor element formed by the conventional method has a drawback in which a leakage current having a current density about 10$^{-8}$ A/cm$^2$ flows across the tantalum oxide film when only a low voltage of about 0.7 V is applied between the upper capacitor electrode 3 and the lower capacitor electrode 2, the amount of the leakage current being not acceptable in a DRAM device. Additionally, the leakage current tends to increase through subsequent thermal treatments at high temperatures, such as activation of implanted ions and fellow of insulating films.

SUMMARY OF THE INVENTION

In view of foregoing, it is an object of the present invention to provide a method for manufacturing a semiconductor device comprising therein a capacitor element having an increased capacitance per unit area and having a low leakage current between electrodes thereof.

According to the present invention there is provided a method for manufacturing a semiconductor device including steps of: forming a polysilicon film on an insulating film overlying a substrate; removing any natural oxide film from the surface of the polysilicon film; after the removing, nitriding the surface of the polysilicon film by lamp-heating to form a silicon nitride film; forming a tantalum oxide film on the silicon nitride film; densifying and nitriding consecutively the tantalum oxide film; after the densifying and nitriding, forming a conductive film on the tantalum oxide film.

With the method for manufacturing a semiconductor device according to the present invention, formation of an SiO$_2$ film is prevented at the interface between the tantalum oxide film and the polysilicon film, so that a higher capacitance per unit area can be obtained. Additionally, the capacitor element has a low leakage current between the electrodes thereof.

BRIEF DESCRIPTION OF THE DRAWINGS

The above and other objects as well as features and advantages of the present invention will be readily understood from the following description with reference to accompanying drawings in which:

FIG. 5 is a graph showing leakage current characteristics in a capacitor element formed according to an embodiment of the present invention as compared to leakage current characteristics in a capacitor element formed by the conventional method.

DETAILED DESCRIPTION OF THE PREFERRED EMBODIMENT

Figure 1A:
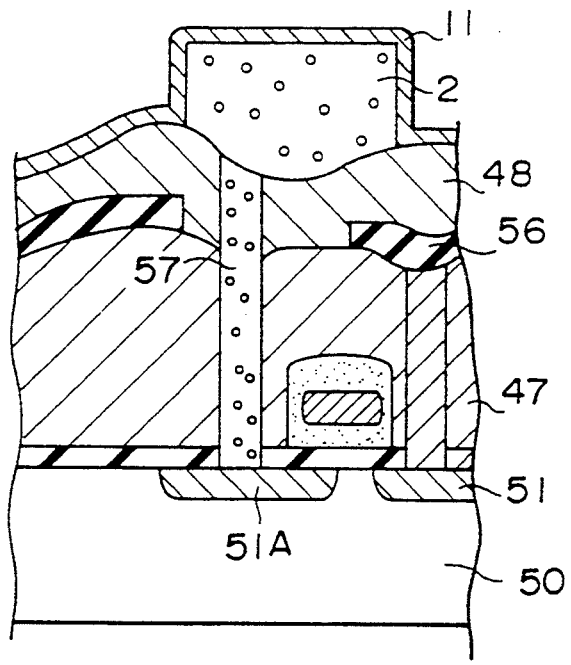
FIGS. 1A and 1B are sectional views of a semiconductor device showing successive steps in a conventional method for manufacturing the semiconductor device.
Figure 1B:
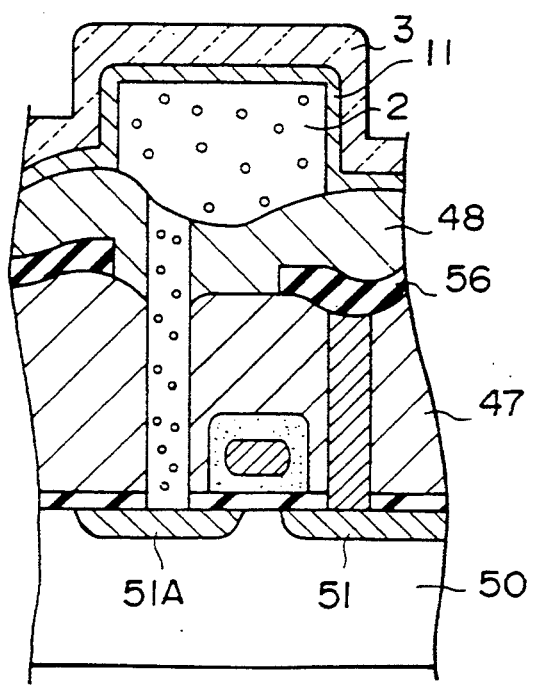

The present invention will now be described by way of an exemplary embodiment with reference to the drawings. In these drawings, similar elements are designated by the same numerals as those in FIGS. 1A and 1B.

Figure 2:
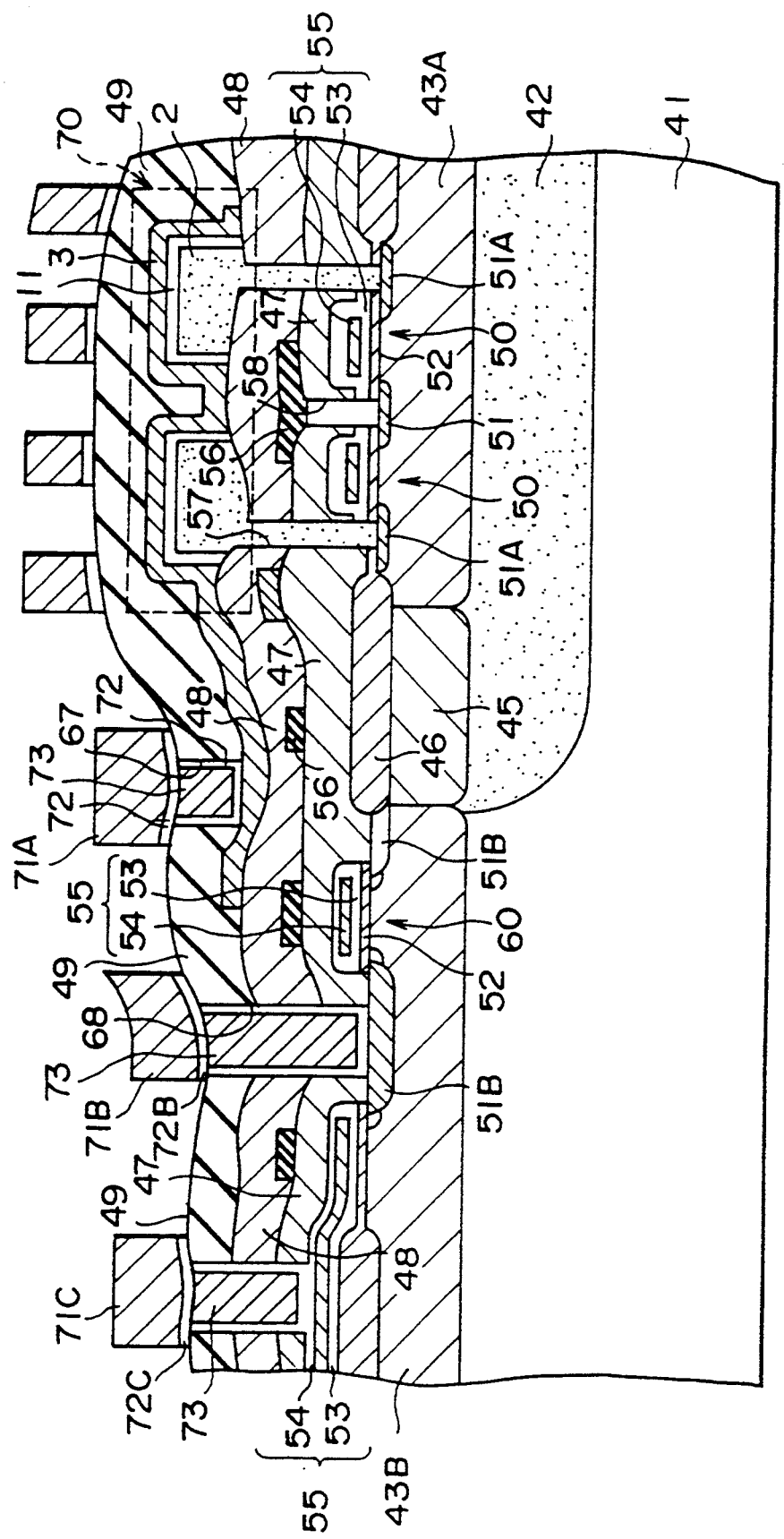
FIG. 2 is a sectional view showing the structure of a DRAM device fabricated by a method according to an embodiment of the present invention.

FIG. 2 is a sectional view off a semiconductor device fabricated by a method according to an embodiment of the present invention. An N-well 42 is formed in a p-type silicon substrate 41 and a first P-well 43A is formed within the N-well 42. A second P-well 43B is formed within the p-type silicon substrate 41, the second P-well 43B being separated from the first P-well 43A by an N+ isolation region 45. N-channel transistor elements are formed in the P-well 43A and 43B isolated from each other by the isolation region 45 and a field oxide film 46.

FIG. 2 shows a pair of memory cells, for simplicity, each constituted by a transistor 50 having active regions in the first P-well 43A, although a large number of memory cells are formed within the first P-well 43A. The pair of memory cells comprise n-type regions 51 and 51A as source and drain regions of the pair of transistors 50 and gate electrodes 55 composed of polysilicon 53 and silicide 54. The pair of transistors 50 are covered by a first interlayer insulating film 47 through which a contact hole 58 filled with a contact connecting a bit line 56 with the n-type region 51, i.e., one of the source and drain regions of and common to the pair of transistors 50. A second interlayer insulating film 48 is formed to cover the bit line 56, following which a pair of stacked capacitor elements surrounded in the drawing by a dotted line 70 are formed on the second interlayer insulating film 48.

Each of the stacked capacitor elements comprises a lower capacitor electrode 2 made of polysilicon, a tantalum oxide film 11 as a dielectric film of the capacitor element and an upper capacitor electrode 3. The lower capacitor electrodes 2 are connected to the respective n-type regions 51A, i.e. the other off the source and drain regions of the transistors 50, via respective contact holes 57 formed in the first and second interlayer insulating films 47 and 48. The upper capacitor electrode 3 is common to the capacitor elements of the pair of memory cells, extending on the tantalum oxide film 11 and the second interlayer insulating film 48.

The upper capacitor electrode 3 is electrically connected via a through-hole 67 to an aluminum electrode 71A maintained at a fixed potential, such as a ground potential, and formed on a third interlayer insulating film 49. The aluminium electrode 71A comprises an aluminium layer and a titanium nitride film 72 underlying the aluminum layer. The through-hole 67 is filled with a tungsten plug 73 and a titanium nitride film 72 covering the tungsten plug 73.

A transistor 60 forming a peripheral circuit of the memory device is shown as having n-type regions 51B in the second P-well 43B, a gate insulating film 52 formed on the P-well 43B, and a gate electrode 55 composed of a polysilicon film 53 and an silicide film 54 and formed on the gate insulating film 52. Aluminum electrode 71B for the transistor 60 is connected to one of the source and drain regions 51B via a contact hole 68 formed through the first, second and third insulating films 47, 48 and 49 and filled with a tungsten plug 73 and a titanium nitride film 72 formed thereon. Another gate electrode 55 of a transistor of the peripheral circuit not shown in the drawing is connected to the aluminum electrode 71C.

Figure 3A:
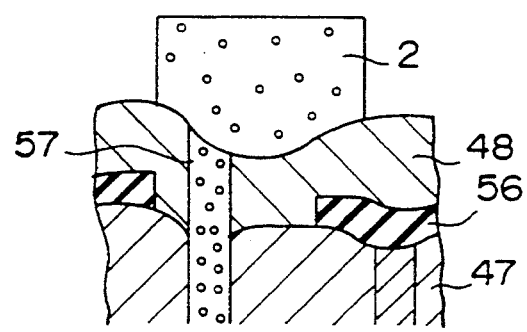
FIGS. 3A, 3B, 3C and 3D are partial sectional views of the semiconductor device of FIG. 2, for showing successive steps in the method for manufacturing the DRAM device of FIG. 2.

FIGS. 3A, 3B, 3C and 3D are partial sectional views of the DRAM device of FIG. 2, showing successive steps in a process for manufacturing the semiconductor device according to an embodiment of the present invention. These drawings illustrate only one of the stacked capacitor elements surrounded by the broken line 70 and a portion underlying the capacitor element as shown in FIG. 2. A polysilicon film to be patterned as the lower capacitor electrode 2 is formed by chemical vapor deposition, then doped with phosphorus, and is subjected to patterning by a photolithographic etching technique, as shown in FIG. 3A. The contact hole 57 may be filled with polysilicon during the chemical vapor deposition of the lower capacitor electrode 2 or during a previous step.

Figure 3B:
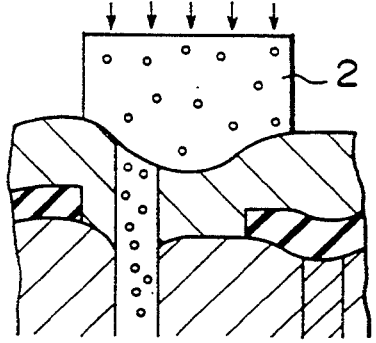

Subsequently, as shown in FIG. 3B, any natural oxide film formed on the surface of the polysilicon film 2 is removed by an anhydrous hydrogen fluoride. The surface of the polysilicon film 2 is then subjected to rapid thermal nitriding (RTN) by lamp-annealing or lamp heating, through which the polysilicon surface is reacted with nitrogen to a silicon nitride film ($SiN_x$). A diluted hydrofluoric acid may be used in place of the anhydrous hydrogen fluoride for removing the natural oxide film. The rapid thermal nitriding is preferably performed at about 800° to about 1100° C. using ammonia ($NH_3$) gas.

Figure 3C:
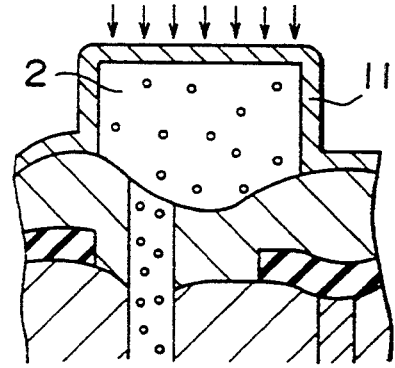
Figure 4:
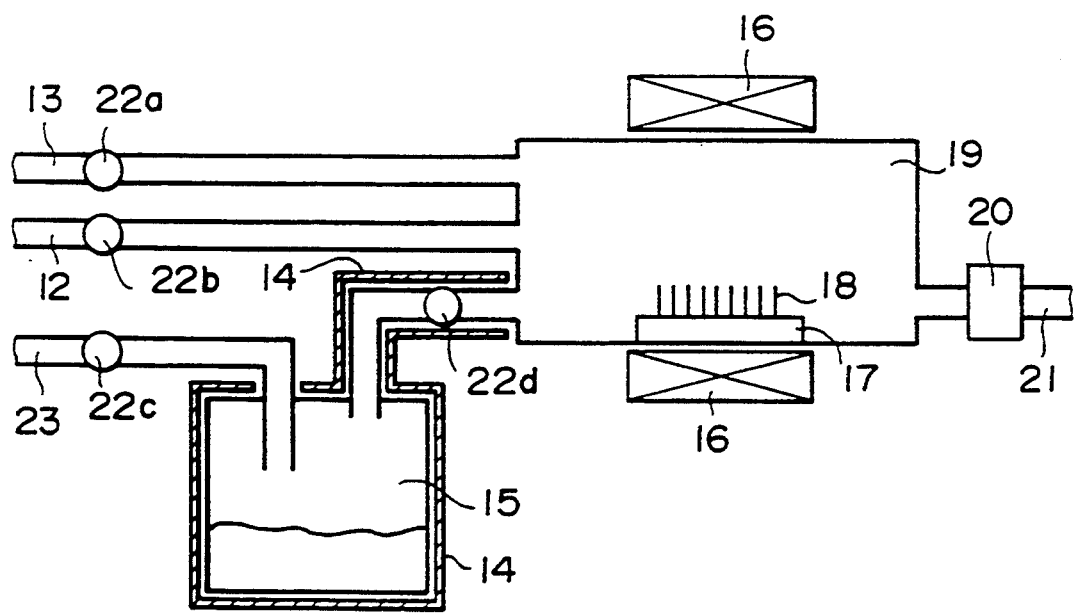
FIG. 4 is a schematic side view of an apparatus used for forming a tantalum oxide film according to the embodiment shown in FIGS. 3A, 3B, 3C and 3D.

Then, as shown in FIG. 3C, a tantalum oxide film 11 is formed on the lower capacitor electrode 2 by chemical vapor deposition. In this step, an apparatus shown in FIG. 4 may be used. A liquid organic tantalum compound such as pentaethoxytantalum contained in a vaporizing chamber 15 is used as a source material, which is vaporized in the chamber 15 by heating with a heater 14. Argon gas serving as a carrier gas for the pentaethoxytantalum gas is supplied by way of an inlet pipe 23 and through a valve 22c. The pentaethoxytantalum gas is thus carried by the argon gas, and introduced through a valve 22d into a reaction chamber 19 in which a substrate holder 17 supporting a semiconductor wafer 18 is placed. An oxidizing gas is also introduced by way of an inlet pipe 12 and through a valve 22b into the reaction chamber 19. The reaction chamber 19 is internally heated by a heater 16 for a chemical vapor reaction of the organic tantalum gas with the oxidizing gas. A tantalum oxide film, not shown in the drawing, is grown in this step in a thickness of about 100 angstrom on the lower capacitor electrode 2.

The preferable growth conditions of the tantalum oxide film are as follows: The temperature at the organic tantalum material is maintained in the range of 30° to 200° C. by the heater 14; the growth temperature in the reaction chamber 19 is maintained in the range of 300° to 800° C. by the heater 16; the flow rate of the argon gas is in the range of 10 to 1000 SCCM (standard cubic centimeters per minute); the flow rate of the oxygen gas is in the range of 0.1 to 20.0 SLM (standard litter per minute); and the total pressure inside the reaction chamber 19 is maintained in the range of 0.1 to 10 Torr.

As shown in the drawing, another inlet pipe 13 is connected to the reaction chamber 19 to introduce argon gas into the reaction chamber 19 through a valve 22a, and a vacuum pump 20 having a discharge port 21 is provided to evacuate the reaction chamber 19.

Subsequently, as shown in FIG. 3C, the tantalum oxide film 11 is densified by a thermal treatment in an oxidizing atmosphere using an electric furnace, then nitrided by a plasma treatment with ammonia by use of a plasma-ion generator. During the nitriding, a tantalum nitride-oxide film ($TaO_xN_y$) is formed on the surface of the tantalum oxide film. The densifying step is preferably conducted at 600° to 1000° C. for 5 minutes to 5 hours. The densifying step may be effectively performed by use of electric furnace, a lamp-heater, plasma-ion generator, or a combination thereof. The densifying step may be conducted by use of nitrous oxide ($N_2O$) as the treatment gas. The nitriding step by plasma treatment is preferably conducted at a temperature ranging from a room temperature to 500° C. under a pressure ranging from 0.1 to 10 Torr, and with the electric power ranging from 50 to 500 W. The nitriding step may be conducted by use of a pure nitrogen gas in place of ammonia.

Figure 3D:
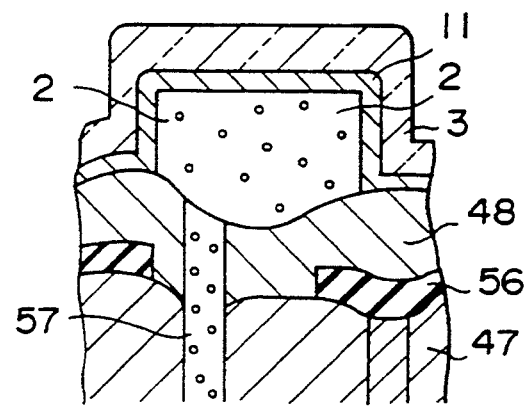

Next, as shown in FIG. 3D, a titanium nitride layer is formed as the upper capacitor electrode 3 on the tantalum oxide film 11. In this embodiment, a single layer of titanium nitride film is used as the upper capacitor electrode, however, a Laminate of tungsten (or titanium nitride)/tungsten layers, titanium nitride/molybdenum layers, or titanium nitride/tungsten silicide layers as well as a single layer of those materials or polysilicon may be effectively adopted.

The capacitor element formed by the process as described above provides a capacitance per unit area Cs (Cs=13.8 fF/$\mu$m$^2$) equivalent to about 2.5 nm in terms of the thickness of an SiO$_2$ film, which is larger than that of a capacitor element obtained by the conventional method. It is found that, in the conventional method, a SiO$_2$ film having a thickness of about 2 nm is formed at the interface between the tantalum oxide film 11 and the polysilicon film 2 due to the thermal treatment conducted at a high temperature in an oxygen atmosphere. In the method according to the embodiment, however, the surface of the polysilicon formed as a lower capacitor electrode 2 is nitrided by the RTN treatment, and the nitrided surface of the polysilicon film suppresses the oxidation of the polysilicon during the densifying treatment of the tantalum oxide film 11, thereby obtaining high capacitance per unit area.

The leakage current characteristics of the capacitor element formed according to an embodiment of the present invention are shown by solid lines in FIG. 5. In the drawing, the leakage current density in terms of A/cm$^2$ is plotted as a function of an effective electric field in terms of (MV/cm)$^{\frac{1}{2}}$. For comparison, the leakage current characteristics of the capacitor element formed by the conventional method are shown by broken lines in this figure. The characteristics are shown for the capacitor elements before and after thermal treatments at high temperatures, conducted for activation of implanted ions, reflow of layer insulating films and the like.

Before thermal treatments at high temperatures, the leakage current characteristics of the capacitor element formed according to the present invention are superior to those of the capacitor element obtained by the conventional method. It is considered to result from the fact that the capacitor element formed by the conventional method has a natural oxide film on the surface of the polysilicon film, while the capacitor element formed by the method according to the embodiment is substantially free from a natural oxide film on the polysilicon film. The natural oxide film is generally considered to have a poor characteristics, deteriorating the performance of the capacitor element.

Moreover, as shown in the FIG. 5, after thermal treatments at high temperatures, the leakage current characteristics of the capacitor element formed by the conventional method are deteriorated to a higher extent than the capacitor element formed by the embodiment of the present invention and the extent of the deterioration drastically increases as the temperature of the thermal treatment is elevated. This is considered due to the reaction of the tantalum oxide film 11 with the upper capacitor electrode 3 during the thermal treatment in the capacitor elements formed by the conventional method. On the contrary, the leakage current characteristics of the capacitor element formed by the present invention are deteriorated to a less extent after performing a thermal treatment. This is considered because the tantalum oxide film, which is nitrided after the densifying treatment, can suppress the reaction of the tantalum oxide film with the upper capacitor electrode 3.

Since above embodiment is described only for an example, the present invention is not limited to such embodiment and it will be obvious to those skilled in the art that various modifications or alterations can be easily made based on the above embodiment within the scope of the present invention.

What is claimed is:

1. A method for manufacturing a semiconductor device including steps of: forming a polysilicon film on an insulating film overlying a substrate; removing any natural oxide film from the surface of said polysilicon film; after said removing, nitriding the surface of said polysilicon film by lamp-heating to form a silicon nitride film; forming a tantalum oxide film on said silicon nitride film; densifying and nitriding consecutively said tantalum oxide film; after said densifying and nitriding, forming a conductive film on said tantalum oxide film.

2. A method for manufacturing a semiconductor device as defined in claim 1, wherein said polysilicon film, tantalum oxide film and conductive film constitute a capacitor element.

3. A method for manufacturing a semiconductor device as defined in claim 2, wherein said semiconductor device is a DRAM.

4. A method for manufacturing a semiconductor device as defined in claim 1 wherein said removing of natural oxide film is conducted using at Least one of an anhydrous hydrogen fluoride and a diluted hydrofluoric acid.

5. A method for manufacturing a semiconductor device as defined in claim 1 wherein said nitriding of polysilicon film is conducted at a temperature between 800° and 1000° C. using ammonia gas.

6. A method for manufacturing a semiconductor device as defined in claim 1 wherein said forming of tantalum oxide film is conducted by a chemical vapor deposition using an organic tantalum compound as a source material.

7. A method for manufacturing a semiconductor device as defined claim 1 wherein said densifying of tantalum oxide film is conducted in an atmosphere containing at least one of oxygen (O$_2$) and nitrous oxide (N$_2$O).

8. A method for manufacturing a semiconductor device as defined in claim 7 wherein said densifying of tantalum oxide film is conducted by heating using one of an electric furnace, lamp-heater, plasma-ion generator and combination thereof.

9. A method for manufacturing a semiconductor device as defined in claim 1 wherein said nitriding of tantalum oxide film is conducted by heating using plasma-ions of at least one of ammonia, nitrogen and nitrous oxide.

10. A method for manufacturing a semiconductor device as defined in claim 1 wherein at least one of said densifying and nitriding of tantalum oxide film is conducted by heating using plasma-ions at a temperature between a room temperature and 500° C., under a pressure between 0.1 and 10.0 Torr with an electric power between 50 and 500 W.

11. A method for manufacturing a semiconductor device as defined in claim 1 wherein said conductive layer is made of a material selected from a group consisting of titanium nitride, tungsten, molybdenum, tantalum, polysilicon and combination thereof.

* * * * *